United States Patent [19]

Fueki

[11] Patent Number: 5,124,560
[45] Date of Patent: Jun. 23, 1992

[54] ELECTRON BEAM EXPOSURE SYSTEM HAVING AN IMPROVED DATA TRANSFER EFFICIENCY

[75] Inventor: Shunsuke Fueki, Yokohama, Japan

[73] Assignee: Fujitsu Limited, Kawasaki, Japan

[21] Appl. No.: 669,592

[22] Filed: Mar. 14, 1991

[30] Foreign Application Priority Data

Mar. 14, 1990 [JP] Japan .................................. 2-063289

[51] Int. Cl.$^5$ ............................................. H01J 37/30
[52] U.S. Cl. .................................. 250/492.2; 250/398
[58] Field of Search .................. 250/398, 492.2, 492.22

[56] References Cited

U.S. PATENT DOCUMENTS

| | | | |
|---|---|---|---|
| 4,541,115 | 9/1985 | Werth | 382/14 |
| 4,718,019 | 1/1988 | Fillion et al. | 250/398 |
| 4,837,447 | 6/1989 | Pierce et al. | 250/398 |
| 4,870,286 | 9/1989 | Tobuse | 250/492.22 |
| 4,996,434 | 2/1991 | Tanaka | 250/492.22 |
| 5,005,138 | 4/1991 | Tobuse et al. | 250/492.2 |

Primary Examiner—Bruce C. Anderson
Attorney, Agent, or Firm—Staas and Halsey

[57] ABSTRACT

An electron beam exposure system comprises a beam source for producing an electron beam, a focusing unit for focusing the electron beam on the object, a first deflector for deflecting the electron beam over a first area, a second deflector for deflecting the electron beam over a second, smaller area, and a control unit for controlling the first and second deflectors by first and second deflector signals. The control unit includes a data control device for producing first address data in response to pattern data, a first memory for storing, in each address, the first deflection data and second, corresponding address data, a second memory for storing, in each address, the second deflection data, and a decoding unit supplied with the first and second deflection data for producing the first and second deflection control signals for controlling the first and second deflectors. The data processing unit, the first memory, the second memory, and the decoding unit are connected with each other by a bus, and each of the units connected to the bus has a data transmitter and a data receiver for sending and receiving data to and from other devices via the bus. Thereby, the first deflection data and the second address data are read out and outputted on the bus in response to the first address given thereto from the data control device, and the second deflection data read out from the second memory in response to the second address data, is outputted on the bus. The first and second deflection data are sent to a deflection controller via the bus and further to the first and second deflectors after conversion.

10 Claims, 14 Drawing Sheets

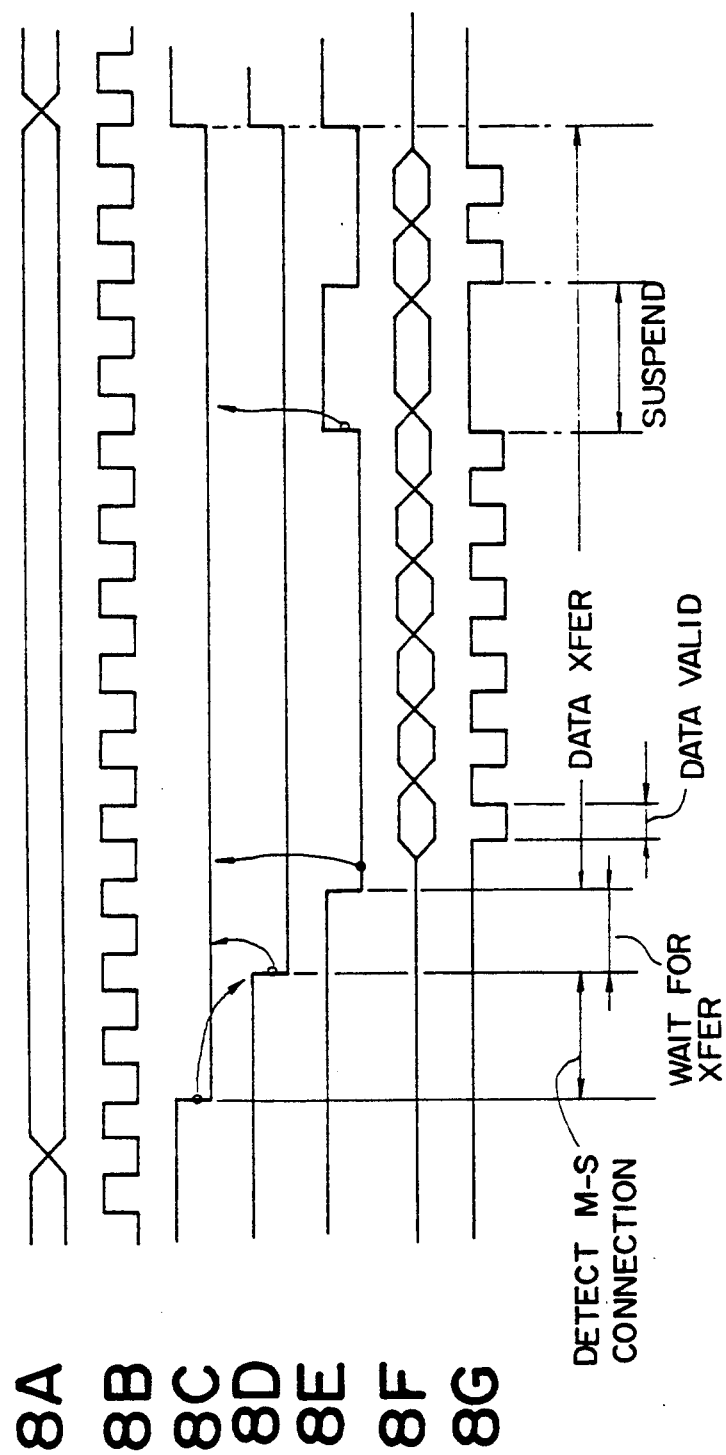

ELECTRON BEAM EXPOSURE SYSTEM HAVING AN IMPROVED DATA TRANSFER EFFICIENCY

BACKGROUND OF THE INVENTION

The present invention generally relates to electron beam exposure systems used for writing a pattern on semiconductor wafers, and particularly to an electron beam exposure system having an improved operational efficiency.

The electron beam exposure system is an essential facility for fabricating high speed, high integration density semiconductor devices that require a sub-micron patterning. By irradiating a finely focused electron beam, one can easily write a pattern on a semiconductor wafer with the line thickness less than 0.3 μm.

On the other hand, the electron beam exposure systems generally have a problem of relatively low throughput because of the fundamental constraint of the electron beam exposure system that the pattern has to be written by "one stroke" of electron beam. In order to overcome the problem of low throughput, various efforts are made particularly about the optical system of the electron beam exposure system.

FIG. 1 shows the construction of a conventional electron beam exposure system 100 proposed in the Japanese patent application 63-275336 corresponding to the U.S. patent application 429,500, the European patent application No. 89311047.8 and the Korean patent application No. 89-15615, which are incorporated herein as reference.

Referring to FIG. 1, the system comprises an electron gun 10 for producing an electron beam B, and the electron beam B thus produced is passed through a shaping aperture 12 after adjustment by an electron beam adjusting system 11. The electron beam B is then passed successively through first through fourth electron lenses 14, 16, 20 and 22 and finally focused on a wafer 26 supported on a movable stage 28, by an objective lens system 24. The objective lens system includes an electromagnetic main deflector 24a and an electrostatic sub-deflector for deflecting the electron beam B on the wafer 26 so that the electron beam B is moved over the surface of the wafer 26 to a desired position.

In order to facilitate the process of exposure and increase the throughput, the electron exposure system has an aperture plate or mask 34 within the electron lens 16. This mask 34 is provided with a number of patterned apertures 34A (FIG. 2) arranged for example in the row and column formation and shapes the electron beam passing therethrough By selecting a particular aperture, the electron beam B given with the shape corresponding to the selected aperture hits the wafer 26 at the designated position. Thereby, a complex semiconductor pattern can be written on the wafer 26 by successively exposing various patterns.

FIG. 2 is a diagram showing the area on the mask 34 that is covered by the electrostatic deflector 30 and the electromagnetic deflector 32, wherein the region designated as 30A represents the area that can be covered by the electrostatic deflector 30 while the region designated as 32A represents the area that can be covered by the electromagnetic deflector 32. The area 32A may have a maximum size of 50 μm × 50 μm and the electron beam is deflected with the minimum pitch of 0.005 μm. On the other hand, the area 30A may have a maximum size of 5 mm × 5 mm and the electron beam is deflected with the minimum pitch of 1 μm.

In order to address the desired aperture 34A on the mask 34, there is provided an electrostatic deflector 30 and an electromagnetic deflector 32 near the optical axis of the electron beam B, wherein the electrostatic deflector 30 has a very fast response and used for deflecting the electron beam B in a relatively limited area of the mask 34. On the other hand, the electromagnetic deflector 32 provides a large deflection angle, though with reduced response, and used for addressing the apertures in the wide area of the mask 34. Only when the deflection by the deflector 30 and the deflection by the deflector 32 are determined, the addressing of the aperture is completed. During the exposure, it should be noted that the stage 28 may be moved in the plane perpendicular to the optical axis as shown by the arrows in FIG. 1.

FIG. 3 shows the construction of a conventionally used control system for driving the electrostatic deflector 30 and the electromagnetic deflector 32.

Referring to FIG. 2, the system comprises a CPU 101 that operates according to the program stored in a magnetic tape device 102. The CPU 101 reads out the exposure data representing the semiconductor pattern to be written on the wafer 26 from the magnetic tape device 102 and sends the same, via a bus 103, to a data manager 104. The data manager 104 extracts, from the exposure data read out from the magnetic tape device 102, the control data for driving the electromagnetic deflector 32 called hereinafter as a main deflector and the control data for driving the electrostatic deflector 30 called hereinafter a sub-deflector. The control data for the main deflector 32 is transferred to a main deflector memory 106 along a line $l_1$ while the control data for the sub-deflector 30 is transferred from the data manager 100 to a band memory 105 via a line $l_2$ and from the band memory 105 to a sub-deflector memory 107 along a line $l_3$. The band memory 105 is used for extracting the speed of movement of the stage 28 from the exposure data.

Further, there is provided a pattern generation and compensation unit 109 that is supplied with the control data of the main deflector memory 106 and the sub-deflector memory 107 for producing digital deflection control signals for the main and sub-deflectors. These deflection control signals for the main and sub-deflectors 32 and 30 are converted into corresponding analog signals by a D/A converter 110 and a D/A converter 111, respectively, and supplied to the deflectors 30 and 32 via respective main amplifiers 112 and 113. Further, in order to control the exposure sequence, a sequence controller 108 is provided for controlling the data compensation unit 109.

In the exposure sequence, the sequence controller 108 issues a command to the data manager 104 and the pattern generation and compensation unit 109, and in response to this, the data manager 104 reads the deflection data stored in the main deflector memory 106 via the line $l_1$ and transfers the same to the pattern generation and compensation unit 109. The unit 109 further reads out the deflection control data stored in the sub-deflector memory 107 in response to the content of the control data read from the main deflection memory 106.

The pattern generation and compensation unit 109 then outputs the digital deflection control signals corresponding to the control data read out from the memories 106 and 107 to the D/A converters 110 and 111 for D/A conversion, and the analog deflection control signals thus obtained are supplied to the main and sub-deflectors 32 and 30 via the main amplifiers 112 and 113, respectively. Thereby, the desired addressing of the aperture in the mask 34 is achieved.

FIG. 4 shows the relationship between the content of the deflection control data stored in the main deflector memory 106 and content in the sub-deflector memory 107. Referring to FIG. 4, the memory 106 stores, in each address, the beam deflection data X and Y such as (0, 0), (100, 100), . . . , respectively representing the X- and Y-coordinates of the electron beam on the mask 34 set by the electromagnetic deflector 32 (See FIG. 2). Further, in correspondence to each set of the beam deflection data X and Y, address data ADR representing the initial address of the sub-deflector memory 107 to be referred to at first and the number of OPC codes to be referred to subsequently to the initial address ADR, are stored. The OPC code represents the code representing the pattern that is addressed on the mask 34. For example, the set (0, 0) at the first address of the main deflector memory 106 for the value of X and Y has the value of ADR of zero and the number of OPC codes of 3. When this content is obtained, as a result of the reading of the main deflection memory 106, the pattern generation and pattern compensation unit 109 specifies the address 0 of the sub-deflector memory 107 and reads the content of three consecutive addresses starting from the address 0.

The sub-deflector memory 106 stores, in each address, the data $X_0$ and $Y_0$ that represent the initial point of the beam to be set by the sub-deflector 30 and the data $X_1$ and $Y_1$ representing the deflection of the electron beam achieved by the sub-deflector 30. FIG. 5 shows the geometrical relationship between the data $(X_0, Y_0)$ and the data $(X_1, Y_1)$ The data $(X_0, Y_0)$ generally coincides with the data (X,Y) representing the deflection of the electron beam by the main deflector 32. In each set of the parameters $X_0$, $Y_0$, $X_1$ and $Y_1$, the position of the electron beam on the mask 34 is determined and the cross section of the electron beam assumes a pattern corresponding to the selected set. Thus, in the foregoing case of $X=0$, $Y=0$, the cross section of the electron beam assumes the three consecutive patterns starting from the address 0 of the sub-deflector memory 107. Similarly, when $X=100$ and $Y=100$ in the main deflector memory 106, the cross section of the electron beam assumes consecutively the three patterns starting from the address 3 (ADR=3) of the sub-deflector memory 107.

In such a conventional electron beam exposure system, there exists a problem in that the reading of the deflection control data from the main and sub-deflector memories 106 and 107 cannot be started until the entire exposure data is stored in the memories 106 and 107. It should be noted that the storage of the deflection control data in the main deflector memory 106 is made from the data manager 104 to the memory 106 via the line $l_1$ while the same line $l_1$ is used for reading the deflection control data. Thus, as long as the line $l_1$ is used for storing the data, the reading of the data from the memory cannot be started.

Further, as can be seen from the logical relationship between the deflection control data stored in the memory 106 and the data stored in the memory 107, the reading of the content of the memory 107 cannot be started until the reading of the deflection control from the memory 106 is completed. Unless the deflection control data for the main and sub-deflectors 32 and 30 are determined, the exposure of the wafer 26 by the electron beam B cannot be started. In other words, the exposure system 100 has to wait for the complete transfer of the exposure data from the magnetic tape device 102 to the memories 106 and 107. Such a process may last as much as several ten minutes for each wafer and the conventional system of FIG. 3 has an inherent problem of low throughput, in addition to the low throughput originating from the "one-stroke" exposure process pertinent to the electron beam exposure systems. Further, in addition to the foregoing low throughput, the system of FIG. 3 has a problem of complex transmission path of data along various lines such as the lines $l_1$, $l_2$ and $l_3$, and associated therewith, there tends to occur undesirable cross-talk or reflection of signals at the time of transferring the data. Such a problem becomes particularly conspicuous when the operational margin for the transmission of data is reduced for maximizing the operational speed of the system.

SUMMARY OF THE INVENTION

Accordingly, it is a general object of the present invention to provide a novel and useful electron beam exposure system wherein the foregoing problems are eliminated.

Another and more specific object of the present invention is to provide an electron beam exposure system having an improved throughput.

Another object of the present invention is to provide an electron beam exposure system for writing a pattern on a wafer by an electron beam, the electron beam exposure system having a mask carrying a number of apertures for shaping the electron beam, a first deflector for addressing the apertures on the mask by deflecting the electron beam with a first pitch and a second deflector for addressing the apertures by deflecting the electron beam with a second pitch substantially smaller than the first pitch, wherein there is provided a data managing unit supplied with exposure data for the pattern to be written on the wafer for extracting first deflection control data specifying the deflection of the electron beam by the first deflector and second deflection control data specifying the deflection of the electron beam by the second deflector, a first memory unit for storing the first deflection control data, a second memory unit for storing the second deflection control data, a first bus connecting the data managing unit to the first and second memory units for passing the first and second deflection control data therethrough, and a pattern generation unit supplied with the first and second deflection control data from the first and second memory units for producing first and second deflection control signals to be supplied to the first and second deflectors, wherein there is provided a second bus connecting the first and second memory units and the pattern generation unit for carrying the first and second deflection control data read out from the first and second memory means to the pattern generation unit. According to the present invention, the reading of the first and second deflection control data from the first and second memory units can be achieved simultaneously to the writing of the first and second deflection control data to the first and second memory units, as the first bus for storing the data is separated from the second bus for reading the data. Further, the present invention reduces the number of lines connecting various units in the system by providing the first and second buses that are used commonly.

Thereby, the problems such as the cross-talk between the lines at the time of transmission of data or the failure in the timing that may lead to the failure in receiving the transmission data are eliminated, and the transfer of data between plural units such as the transfer of data from one unit to a plurality of units can be achieved without problem.

Other objects and further features of the present invention will become apparent from the following detailed description when read in conjunction with the attached drawings.

BRIEF DESCRIPTION OF THE DRAWINGS

FIGS. 8(A)–8(G) are timing charts showing the various signals used in the system of FIG. 7 for data transfer;

DETAILED DESCRIPTION

Figure 1:
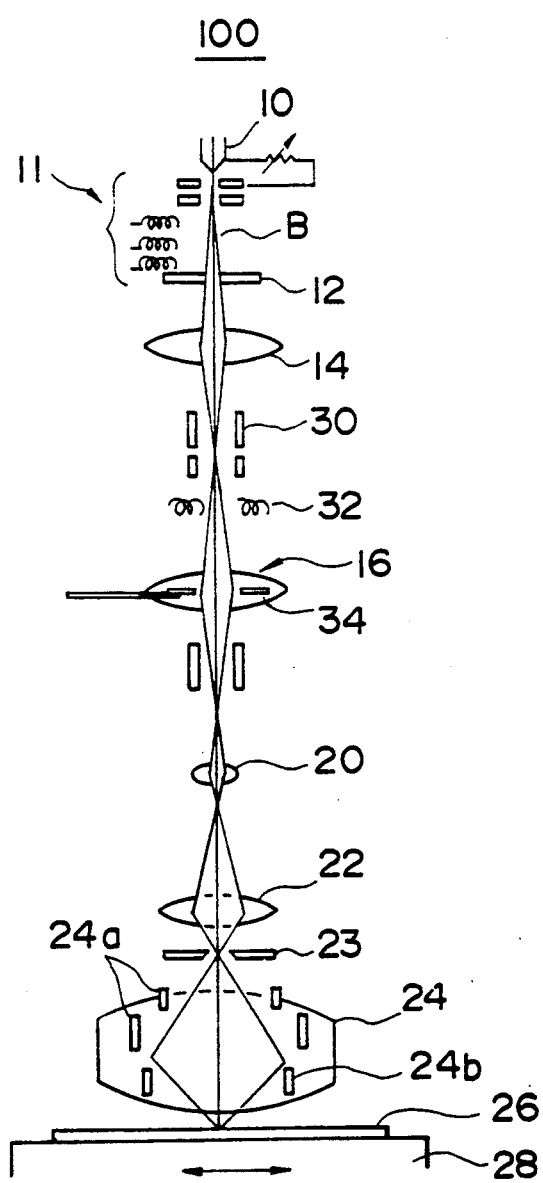
FIG. 1 is a diagram showing the construction of the optical system of a conventional electron beam exposure system.
Figure 2:
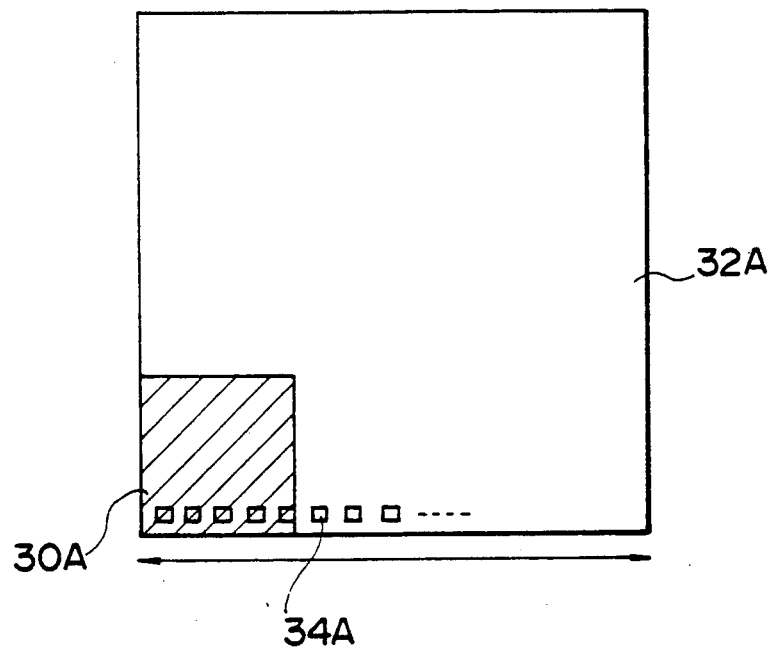
FIG. 2 is a diagram showing the deflection of electron beam for achieving a shaping of the beam by addressing apertures on a mask in the system of FIG. 1.
Figure 6:
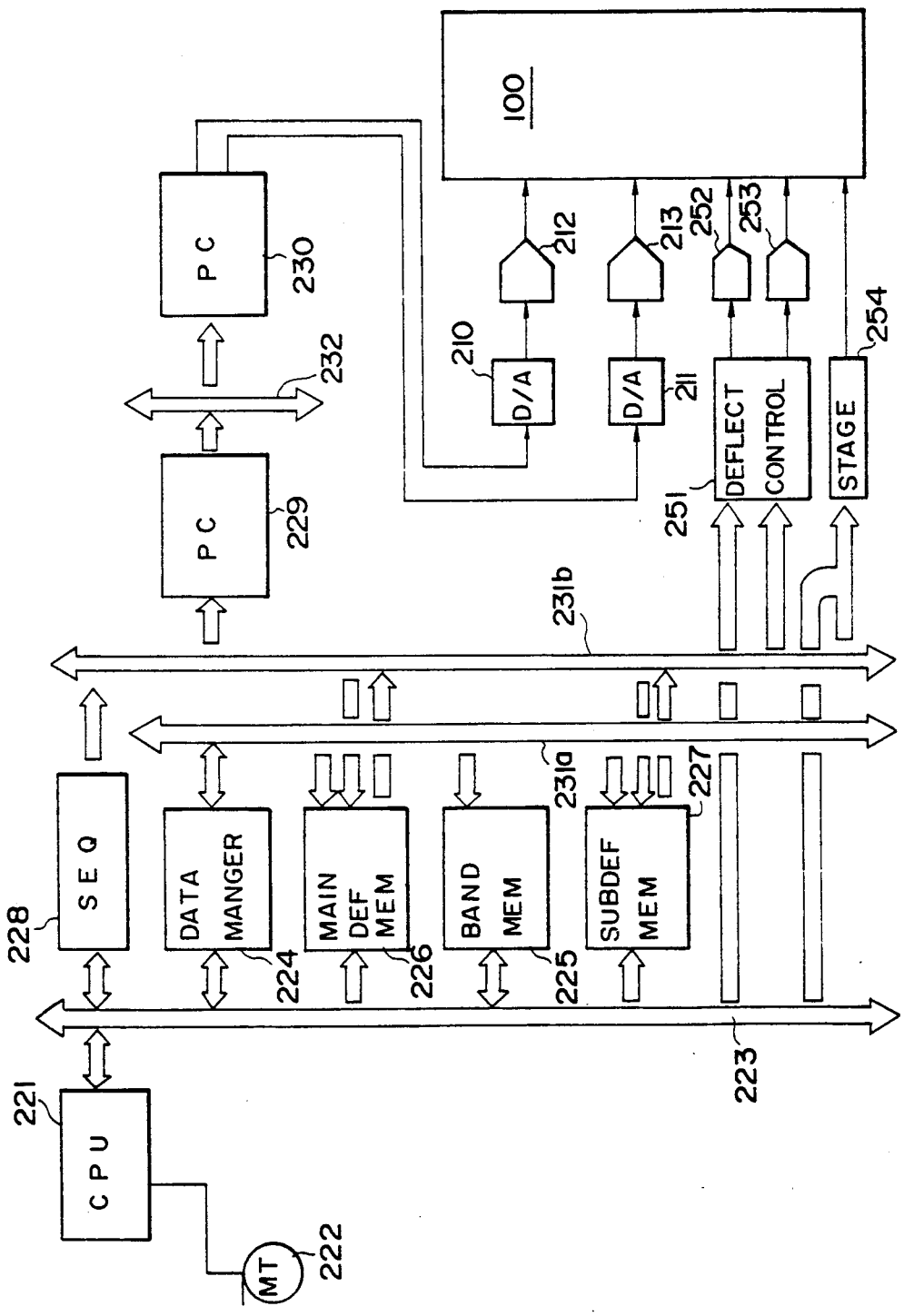
FIG. 6 is a block diagram showing the overall construction of the electron beam exposure system according to a first embodiment of the present invention.

FIG. 6 shows a first embodiment of the electron beam exposure system according to the present invention. This system is designed to cooperate with the electron beam optical system 100 of FIG. 1, and various parts of the system 100 will be referred to in the following description with the reference numerals as represented in FIG. 1.

Figure 3:
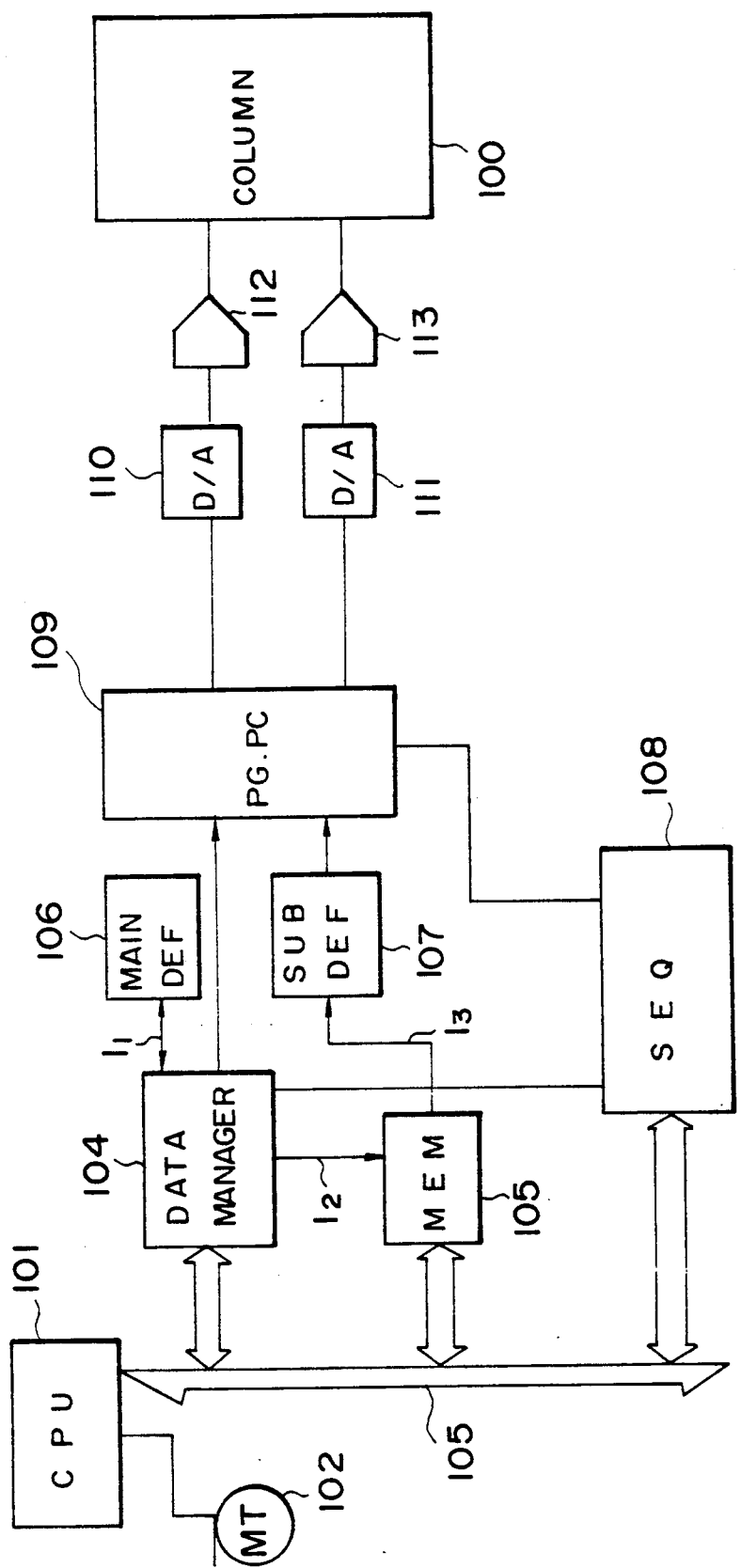
FIG. 3 is a block diagram showing the construction of the control system for deflecting the electron beams to achieve the beam shaping shown in FIG. 2.

Referring to FIG. 6, a CPU 221 corresponding to the CPU 101 of FIG. 3 reads the pattern data to be written on the wafer 16 from a magnetic tape device 222 corresponding to the device 102 of FIG. 3, and supplies the same on a first bus 223. It should be noted that the pattern data is stored in the magnetic tape in the compressed form as usual and the CPU 221 decompresses the data to retrieve the original pattern data. In addition to the pattern data, the CPU 221 sends various commands and control signals on the bus 223. To the bus 223, various units such as a sequence controller 228 corresponding to the sequence controller 108 of FIG. 3, a data manager 224 corresponding to the data manager 104, a main deflector memory 226 corresponding to the main deflector memory 106, a sub-deflector memory 227 corresponding to the sub-deflector memory 107, and a band memory 225 corresponding to the band memory 105, are connected.

Figure 4:
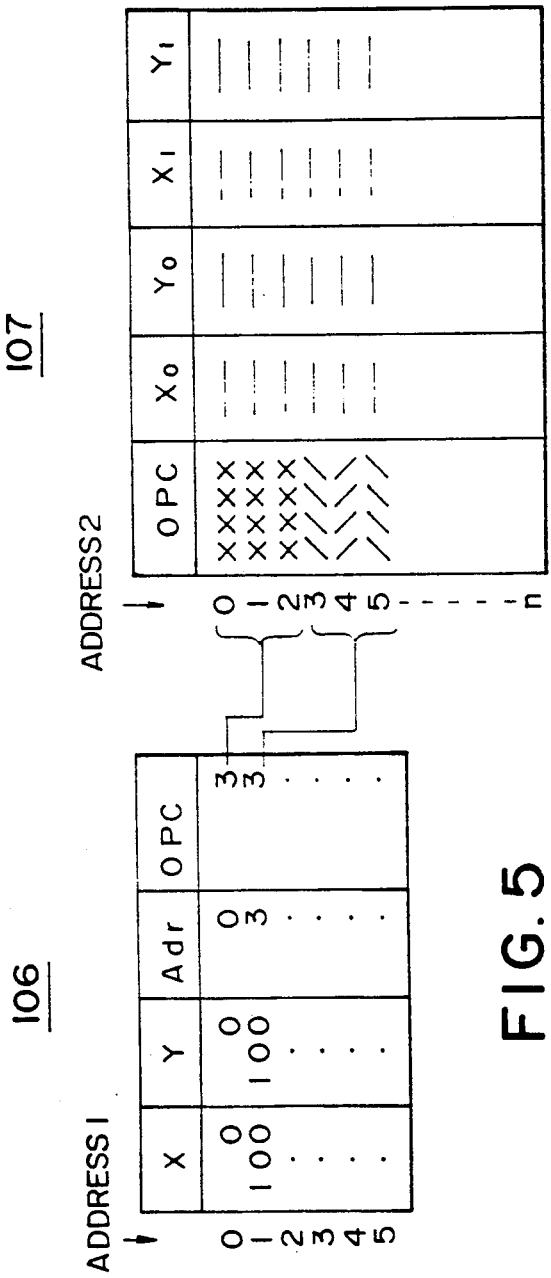
FIG. 4 is a diagram showing the logic relationship between first deflection control data used in the system of FIG. 3 and second deflection control data also used in the system of FIG. 3.
Figure 5:
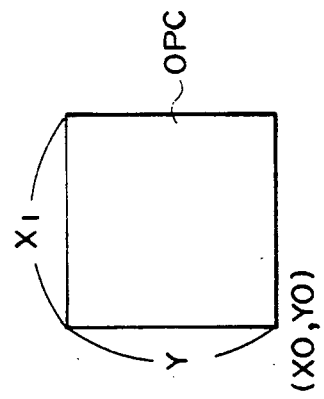
FIG. 5 is a diagram showing the geometrical parameters that define the beam deflection.

Further, a second bus 231a is provided in connection with the data manager 224, the main deflector memory 226, the band memory 225 and the sub-deflector memory 227 for supporting the exchange of data therebetween. In this embodiment, it should be noted that there is provided a third bus 231b in connection with the data manager 224, the main deflector memory 226, the sub-deflector memory 227 and the sequence controller 228 also for supporting the exchange of data therebetween. Further, a pattern generator 229 corresponding to the pattern generation and compensation unit 109 is connected to the third bus 231b for receiving the deflection control data for the main and sub-deflectors 32 and 30 from the main deflector memory 226 and the sub-deflector memory 227 respectively, for producing the digital deflection control signals in response thereto. This digital deflection control signal represents the magnitude of electric energization to be applied to the main and sub-deflectors 32 and 30. On the other hand, the content of the deflection control data stored in the memories 226 and 227 and read out therefrom are already described with reference to FIG. 4.

The digital deflection control signal is then supplied to a pattern compensator 230 also corresponding to the pattern generation and compensation unit 109, for applying necessary correction to the deflection angle for compensating various distortions in the beam path. The digital deflection control signals thus processed in the pattern compensator 230 are then converted to the analog deflection control signals by D/A converters 210 and 211 and supplied to the main and sub-deflectors 32 and 30 respectively after amplification by amplifiers 212 and 213.

Further, a deflection controller 251 for driving the deflectors 24a and 24b is provided in connection to the bus 223 and the bus 231b for receiving the pattern data from the CPU 221 and for receiving the control command from the sequence controller 228. Thereby, the deflection controller produces driving signals driving the deflectors 24a and 24b as commonly practiced. Thus, the driving signal for the deflector 24a is supplied via a main amplifier 252 while the driving signal for the deflector 24b is supplied via a main amplifier 253. Also, there is provided a stage controller 254 for driving the movable stage 28 such that the stage controller 254 is supplied with the pattern data from the CPU 221 via the bus 223 and further with the control command from the sequence controller 228 via the bus 231b as usual. As the construction and arrangement of the deflection controller 251 and the stage controller 254 are substantially identical with the case of conventional system, further description thereof will be omitted.

In operation, the data manager 224 fetches the pattern data on the bus 223 and expands the same into the main deflection control data for the main deflector memory 226 and the sub-deflection control data for the sub-deflector memory 227, and outputs the same on the second bus 231a. Simultaneously, the data manager 224 produces an address data on the first bus 223 specifying the address of the memories 226 and 227 in which the main and sub-deflector control data are to be stored, together with the command instructing the memories 226 and 227 to fetch the main and sub-deflection control data on the second bus 231a. In response to the command and the address data on the bus 223, the main and sub-deflector memories 226 and 227 fetches the main and sub-deflection control data on the bus 231a. Further, there may be a command to the memory 225 via the bus 223 that, in this case, receives the data outputted from the data manager 224 on the bus 231a for extracting the data indicating the moving speed of the stage 28.

While carrying out the foregoing operation, the sequencer 228 produces a command for commanding the start of reading the content of the memories 226 and 227 for those parts that are already stored. The command includes the address data of the main deflector memory 226 from which the data should be retrieved. This command of the sequencer 228 is then transmitted via the bus 223 and enables the reading operation of the memories 226 and 227. In response to this, the memory 226 at first outputs the content at the specified address on the bus 231b. As described previously with reference to FIG. 4, the content of the memory 226 includes the address ADR of the memory 227 from which the reading of the sub-deflection control data is to be started and the number of readings to be made subsequently, in addition to the coordinate X and Y of the electron beam to be positioned by the electromagnetic deflector 30. This data is then transferred to the memory 227 via the bus 231a and the memory 227 extracts the address data ADR and the number of patterns to be subsequently addressed. In response to this, the memory 227 outputs the data $X_0$, $Y_0$, $X_1$ and $Y_1$ to the pattern generator 229 via the bus 231b. Further, the band memory 225 produces the data representing the speed of movement of the stage 28 on the bus 231b to the pattern generator 229 in response to the pattern data outputted from the data manager 224 on the bus 231a, and sends the same to the sequence controller 228 via the bus 223. In response to the data supplied thereto, the pattern generator produces the digital deflection control signals as already described, and this digital deflection control signals cause the deflection of the electron beam E.

Next, a more detailed construction of the buses 231a and 231b as well as the bus 232 will be given together with cooperating units provided in the blocks such as the data manager 224, the memories 225–227, the sequence controller 228 and the pattern generator 229 for exchanging data with each other via these buses. It should be noted that as these buses are used commonly by a plurality of units such as the data manager 224 for both the transmission and reception, they have to have a construction that is suitable for supporting such an exchange of data.

Figure 7:
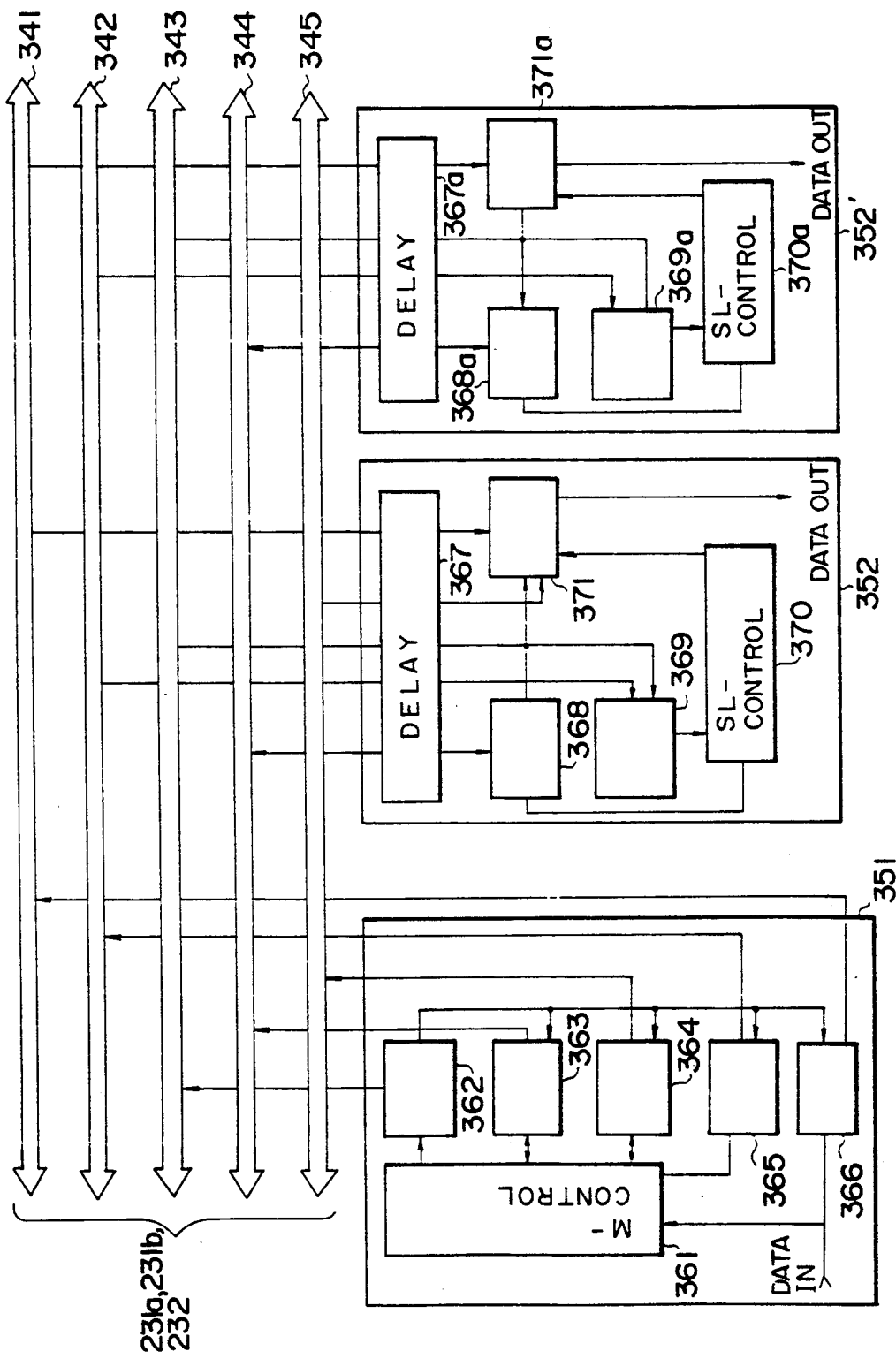
FIG. 7 is a block diagram showing a detail of the electron beam exposure system of FIG. 6 configured according to a second embodiment of the present invention.

Referring to FIG. 7 showing the construction of the buses 231a, 231b and 232, the bus comprises a number of bus members including a data transfer bus 341 for carrying the data to be exchanged, a device identification code bus 42 for carrying a device identification code that is used for identifying the device such as the sub-deflector memory 227 to which the data is to be directed, a clock bus 343 for carrying a data fetch clock that provides the timing for fetching the data on the bus 341, an arbitration bus 344 for carrying a bus request signal requesting the use of the data bus 341 and acknowledgement signals acknowledging thereto, and a strobe bus 345 that carries a strobe signal sent in synchronization with the data on the bus 341.

In order to transmit the data via the bus 341a, each of the blocks such as the data manager 224, the main deflector memory 226, the sub-deflector memory 227 and the like, has a master module 315 shown in FIG. 7 for transmitting the data on the bus 341 and a slave module 352 or 352' shown in FIG. 7 for receiving the data from the bus 341. These blocks carry out the exchange of data via the master and slave modules according to a predetermined protocol as will be described later.

Referring to FIG. 7, the master module 351 comprises a data input/output buffer 366 supplied with data from the block that includes the module 351 for sending the same on the data bus 314, a clock generator 362 for producing the clock and sending the same on the clock bus 343, a requester 363 for producing the bus request signal and sending the same on the arbitration bus 344, a strobe generator 364 for producing the strobe signal and sending the same on the strobe bus 345, and a device code generator 365 for producing the device identification code and sending the same on the bus 342. Further, the master module 351 includes a master controller that is supplied with the data from the block cooperating with the module 351 and controls the clock generator 362, the requester 363, the strobe generator 364 and the device identification code generator 365.

Similarly, each block includes a slave module 352 that includes a data input/output buffer 371 supplied with the data on the data bus 341 and the strobe on the bus 345 for passing the supplied data to the block that cooperates with the slave module 352 in response to the strobe, a data acquisition unit 368 supplied with the bus request signal on the arbitration bus 344 for enabling the buffer 371 in response to the strobe, and a device code receiver unit 369 for receiving the device identification code from the bus 342. Further, there is provided a slave controller 379 for controlling the input/output buffer 371 and the acquisition unit 368 in response to the device identification code that is retrieved by the device code receiver unit 369. Furthermore, there is provided a delay adjustment unit 367 between each bus member 341–345 of the bus and the corresponding unit 368, 369 and 371 of the slave module 352 for compensating the delay in the data transfer caused by the bus.

Some of the blocks in FIG. 6 such as the data manager, the main deflector memory 226, the sub-deflector memory 227 and the like, may have both the master module and the slave module while some of the blocks such as the band memory may have only the slave module. Further, there may be a case that a single block has a plurality of slave modules for receiving data from both the bus 231a and the bus 231b.

FIGS. 8(A)–8(G) show the operation of the system of FIG. 7.

Referring to the drawings, when data to be transmitted occurs in the block such as the data manager 224, the device identification code generator 365 in the master module 351 that is included in the block 224 sends a device identification code shown in FIG. 8A designating a block such as the main deflector memory 226 on the bus 341 under the control of the master controller 361. Further, the clock generator 363 in the master module 351 sends the clock on the bus 343 as shown in FIG. 8B.

Next, the requester 363 sends a bus request signal on a first line forming the arbitration bus 344 as shown in FIG. 8C, and waits for the response on a second line of the bus 344 from the slave module of the main deflector memory 226 that is designated by the device identification code. When there is no response in a predetermined interval indicating that there is no block that has the designated device identification code, the requester 363 inverts the logic level of the bus request signal and notifies the absence of the response to the master controller 361. Thereby, the master controller 361 cancels the data transmission.

On the other hand, the slave module in the main deflector memory 226, watching out for the bus request signal on the arbitration bus 344, sends a first acknowledge signal on a second line of the bus 344 as shown in FIG. 8(D) when there is a device identification code on the bus 343 addressing the memory 226. In order to carry out this, the slave controller 370 of the slave module 352 in the main deflector memory 226 discriminates the device identification code received by the device identification code receiver unit 369 and urges the acquisition unit 368 to send the first acknowledge signal when the received device identification code agrees with the device identification code of the main deflector memory 226. If not, the slave controller 370 disables the acquisition unit 368 such that the first acknowledge signal is not returned.

Further, the slave controller prepares for the reception of the data via the bus 341 by energizing the data input/output buffer 371 as well as by preparing the memory 226 for storing the data. When the preparation is ready, the slave controller 370 once again urges the acquisition unit 368 to send a second acknowledge signal shown in FIG. 8(E) to a third line of the bus 344.

This second acknowledge signal is detected by the requester 363 of the master module 351, and in response to this, the master controller 361 reads the data from the data manager 224 in synchronization with the strobe produced by the strobe generator 364. The master controller 361 sends the data thus read out to the input/output buffer 366 and further to the data bus 341 as shown in FIG. 8(F) in synchronization with the strobe shown in FIG. 8(G) that is outputted on the strobe bus 345.

The slave module 352 of the main deflector memory 226, in turn, receives the data on the data bus 341 in synchronization with the strobe on the bus 345 and sends the data to the main deflector memory 226 successively. When there is a need to interrupt the transmission, the slave controller 370 of the slave module 352 causes the inversion of logic level in the second acknowledge signal via the acquisition unit 368 and the inversion of the second acknowledge signal, detected by the requester 363 monitoring the data on the arbitration bus 344, causes the master module 351 to stop transmission of the data. The transmission is suspended until the logic level of the second acknowledge signal on the bus 344 returns to the original.

Figure 9A:
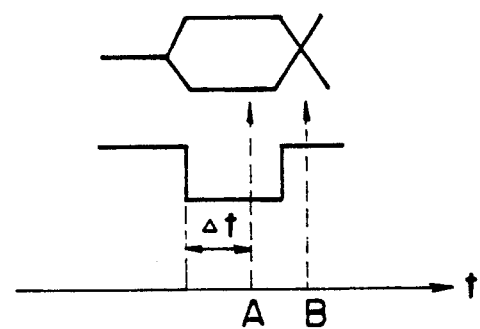
FIGS. 9(A)–9(C) are diagrams showing the wave form of signals appearing in the system of FIG. 7.

It should be noted that the strobe on the bus 345 represents the interval in which the data on the data bus 341 assumes the valid logic level. Thus, the slave module 352 of the main deflector memory 226 reads the data on the bus 341 in synchronization with the falling edge of the strobe of FIG. 8. However, it needs some time, measured from the falling edge of the strobe, until the slave module 352 stabilizes for receiving the data. Referring to FIG. 9(A), when the data is read with a timing A delayed by $\_t$ from the falling edge of the strobe for stabilizing the slave module 352, a correct data reception can be achieved. On the other hand, when the reading of data is made with a timing B, the correct data reception cannot be made anymore. From the viewpoint of increasing the throughput of the electron beam exposure, it is necessary to reduce the duration of the strobe pulse as much as possible. This imposes a stringent requirement about the time needed for the slave module to stabilize after it is triggered.

Figure 9B:
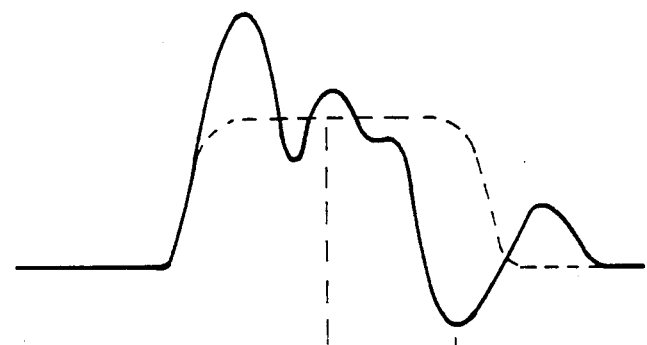
Figure 9C:
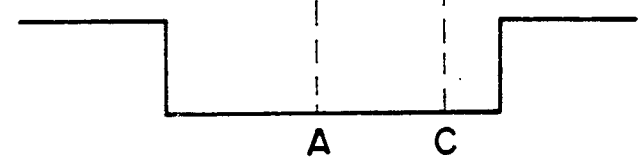

Further, it should be noted that, as shown in FIG. 9(B), each data or datum on the bus 341 has a complex waveform because of the complex reflections of signals during the transmission and the like. Because of this, there may be a proper timing of reading of the data within the strobe pulse as shown in FIG. 9(C). Referring to FIG. 9(C), the timing A may provide a correct reading of the data while the timing C may provide an erroneous reading because of the undershoot in the waveform.

Figure 10A:
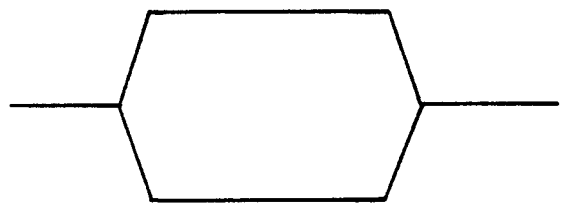
FIGS. 10(A)–10(C) are diagrams showing the relationship in the timing between the signals in the system of FIG. 7.
Figure 10B:
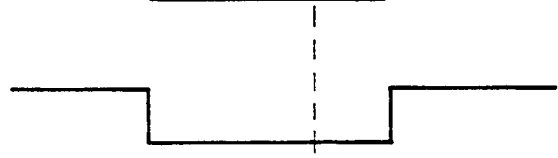
Figure 10C:

In order to circumvent this problem, the system of FIG. 7 uses the data fetch clock shown in FIG. 8(B) in addition to the strobe of FIG. 8(G). Referring to FIGS. 10(A)–10(C) showing the detailed relationship between the data, the clock and the strobe, the clock is given in advance to the strobe and the reading of the data is made after a delay $\_T$ from the rising edge of the clock. This delay $\_T$ is given by the delay adjustment unit 367 that sets the value of $\_T$ for each slave module. Thereby, a reliable, error-free transfer of the data can be achieved even when the duration of the strobe pulse is decreased for the high speed operation of the system.

It should be noted that the foregoing description about the construction and operation of the data transfer system applies also to other blocks in the system of FIG. 6. Thus, the description of the master module, slave module and the bus shown in FIG. 7 will not be repeated for each combination of the blocks in FIG. 6.

Figure 11:
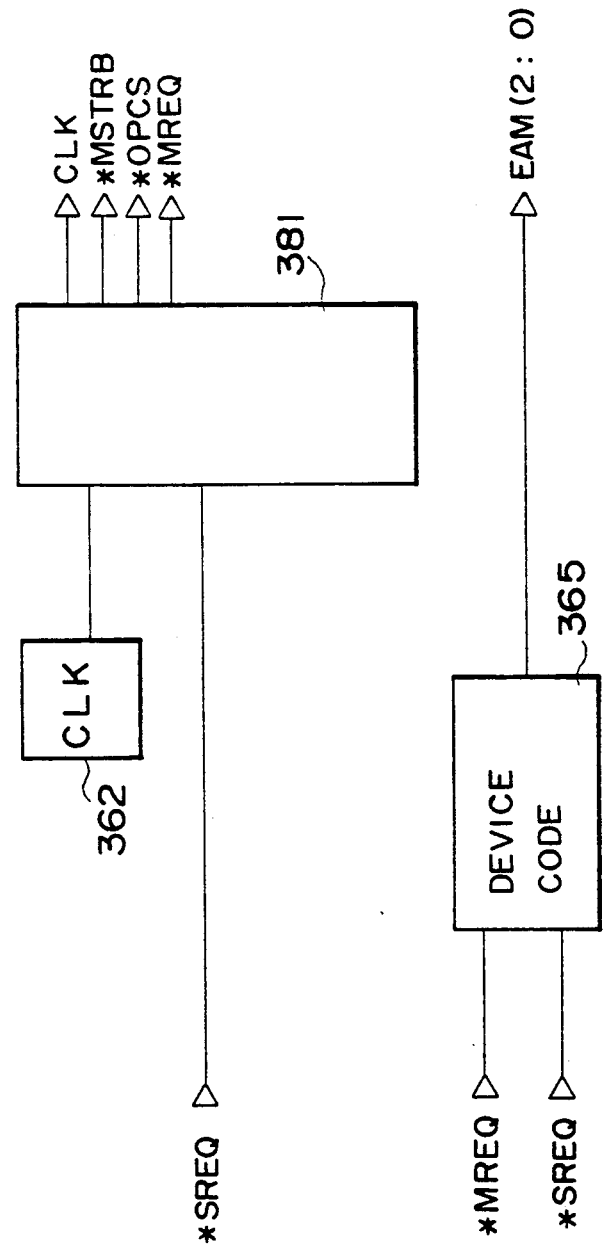
FIG. 11 is a block diagram showing the construction of a master module used in the circuit of FIG. 7.

FIG. 11 shows the construction of a part of the master module 351 in the sub-deflector memory 227. It should be noted that master module 351 of the sub-deflector memory 227 is used to transfer the content of the memory 227 on the bus 231b. As already noted, the content of the memory 227 thus read out includes a series of the data set $X_0$, $X_0$, $X_1$ and $Y_1$ that are successively read out for a plurality of times corresponding to the OPC number specified by the content of the main deflector memory 226.

Referring to the drawing, the requester 363, the master controller 361 and the strobe generator 364 form a control circuit 381. The clock generator 362 and the device identification code generator 365 have the same reference numeral as in the case of FIG. 7. The clock generator 362 is basically an oscillator circuit for producing a 25 kHz fundamental clock and a frequency divider for producing a 10 kHz clock CLK from the 25 kHz clock. This clock CLK thus produced is used for the data fetch clock of FIG. 8(B). As already noted, the data fetch clock is advanced with respect to the data and the strobe by several ten nanoseconds, and this advance is adjusted depending on the destination to which the data is to be transferred. More specifically, the amount of advance is adjusted in response to the delay given by the delay adjustment unit 367 of each slave unit.

The device identification code generator 365, on the other hand, has a device code register (not shown) in which the device identification code of the slave module, to which the data transfer is to be made, is set by the master module 365. This device identification code is represented as EAM (2:0).

Further, the control circuit 381 outputs a *MREQ signal on the first line of the arbitration bus 344 as the bus request signal while receives a *SREC signal and a *SREQ signal from the second and third lines of the arbitration bus 344 as the authorization signals. Furthermore, the control circuit 381 produces a *MSTRB signal on the strobe bus 345, and a *OPCS signal on the data bus 341. This *OPCS signal represents the number of patterns to be read out starting from the address ADR.

Figure 12:
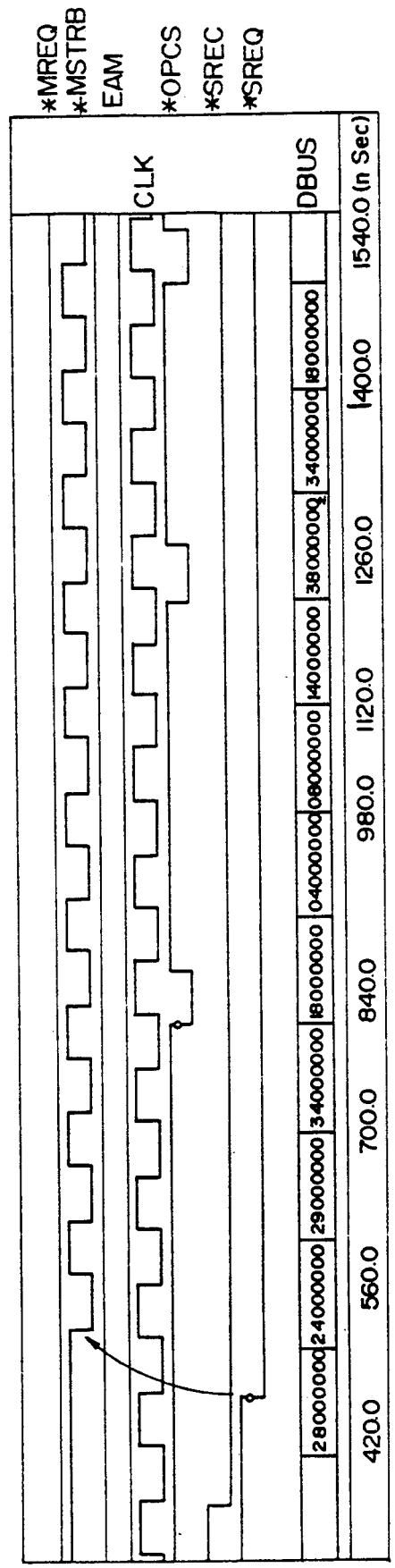
FIG. 12 is a timing chart showing an example of operation of the master module of FIG. 11.

FIG. 12 shows the timing of operation of the circuit of FIG. 11. The operation is essentially the same as those shown and described with reference to FIGS. 8(A)-8(G) except that FIG. 12 includes the *OPCS signal that is carried by the data bus 341 for marking the beginning of new set of data. The *OPCS signal is given each time the reading from a new address ADR is started. The horizontal axis of FIG. 12 shows the actual time scale represented by nanoseconds.

Figure 13:
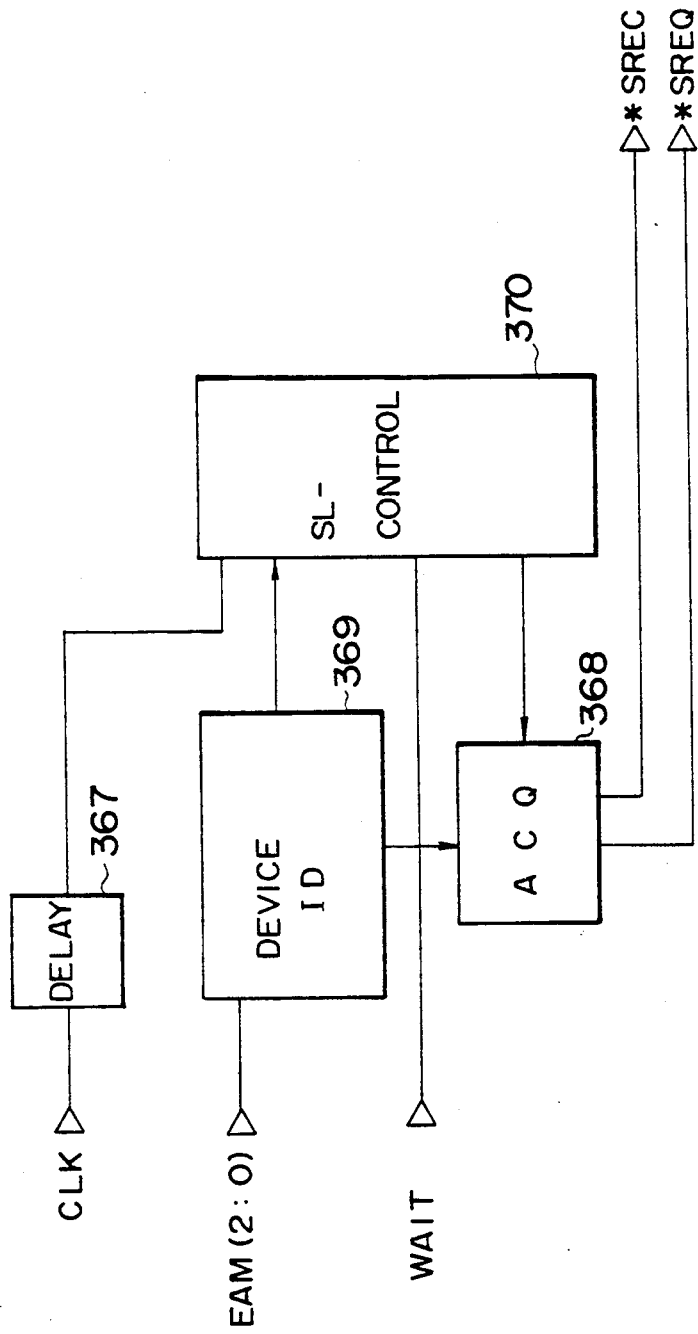
FIG. 13 is a block diagram showing the construction of a slave module used in the circuit of FIG. 7.

FIG. 13 is a circuit diagram showing a part of the slave module 352 that receives the data read out from the sub-deflector memory 227. In FIG. 13, the parts corresponding to the parts of FIG. 7 are given the identical reference numerals and the description thereof will be omitted.

The circuit of FIG. 13 is supplied with the data fetch clock CLK from the bus 343 via the delay adjustment unit 367. Similarly, the device identification code receiver unit 369 receives the EAM (2:0) signal from the bus 342 and notifies the same to the slave controller 370. The unit 369 may have the own identification code in the form of setting of dip switch and the like, and energizes the acquisition unit 368 in response to the agreement of the device identification code received by the receiver unit 360 with the code set in the unit 369. Thereby, the acquisition unit 368 produces the first and second acknowledge signals *SREC and *SREQ.

Figure 14:
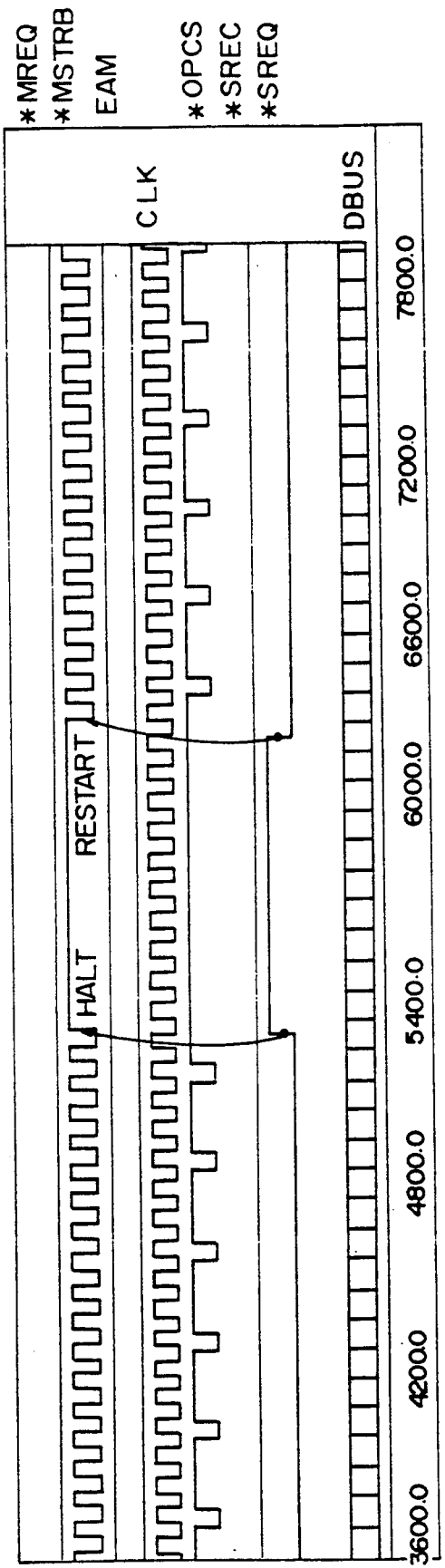
FIG. 14 is a timing chart showing an example of operation of the circuit of FIG. 7.

It should be noted that when the slave circuit is used for the main deflector memory or sub-deflector memory, there occurs a wait request WAIT from the memory time to time, asking for suspending the flow of data coming in via the bus 341. Such a wait request occurs for example when the memory is undertaking the refreshment operation. In such a case, acquisition unit 368, outputting the *SREC signal and the *SREQ signal on the second and third lines of the arbitration bus 344 inverts the logic level of the *SREQ signal as shown in FIG. 14, and the master module sending the data inverts the *MREQ signal on the bus 344 in response thereto. Thus, FIG. 14 corresponds to FIGS. 8A-8G.

Figure 15:
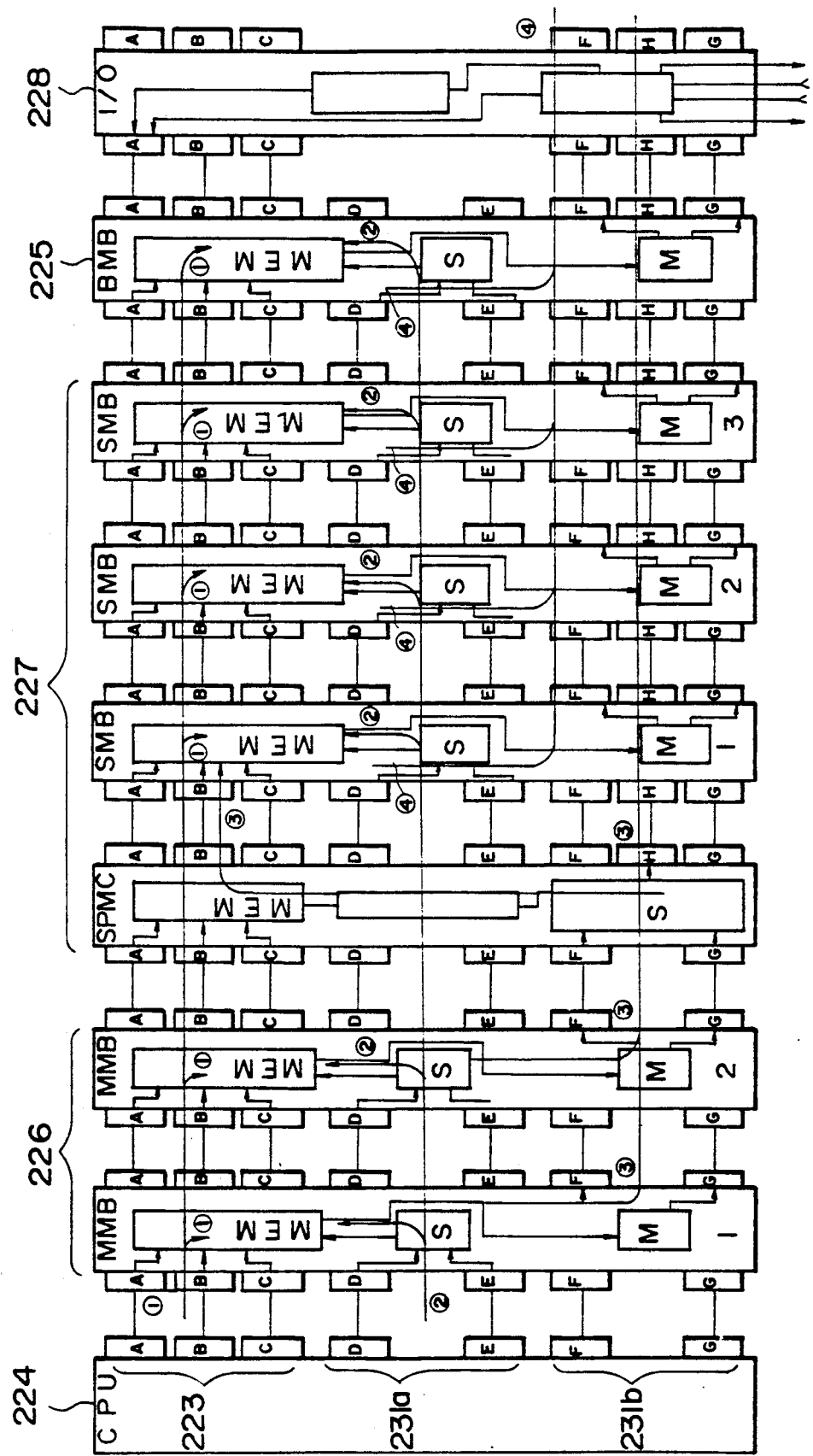
FIG. 15 is a diagram showing the connection of circuit boards corresponding to the system of FIG. 6.

FIG. 15 is a diagram showing the connection of circuit boards carrying the integrated circuits for forming a part of the system of FIG. 6.

Referring to FIG. 15, the circuit boards designated as MMB forms the main deflector memory 226, the circuit boards designated as SMB form the sub-deflector memory 227, the circuit boards designated as SPMC form a managing part of the sub-deflector memory 227, the board BMB is the band memory 225, and the board I/O is an interface part of the sequence controller 228. On the other hand, the circuit board designated as CPU forms the data manager 224 of FIG. 6.

In each board, the part designated as M represents the master module 351, the part designated as S represents the slave module 352, and the part designated as MEM represents the memory integrated circuit. The circuit boards have terminals A-H, wherein the terminals A, B and C represent the terminals for connection to the bus 223, the terminals D and E represent the terminals for the bus 231a, and the terminals F-H represent the terminals for the bus 231b.

In operation, the command from the data manager 224 is sent to the band memory 225, the main deflector memory 226 and the sub-deflector memory 227 along the bus 223 as shown by a path 1. As already noted, the band memory 225 is used to estimate the necessary stage moving speed from the number of data to be stored in the main deflector memory 226. This part is not essential to the present invention. The exposure data produced by the data manager 224, on the other hand, is sent to the memory 226 and the memory 227 along a path 2 through the bus 231a and stored therein. When reading the content of the memories, the content of the memory 226 is first read out through the bus 231b via the master module M and passed to the I/O interface of the sequence controller 228 along a path 3. Further, the data on the bus 231b is received by the slave module S of the data managing part SPMC of the memory 227, and the address ADR as well and the OPC number are extracted therefrom by the SPMC. The data thus extracted are sent to the memory integrated circuits MEM along the path 3 through the circuit boards forming the memory 227 and used therein as the address data. The data thus read out is outputted on the bus 231b via the master module M along the path 4. Thereby, the operation described with reference to FIG. 6 is obtained.

In the description heretofore, the present invention has been explained with reference to the electron exposure system of FIG. 1 generally called the block-type. However, the present invention is by no means limited to the addressing of the mask as is achieved in this system but is applicable also for other type of electron beam exposure systems.

Further, the present invention is not limited to the embodiments described heretofore, but various variations and modifications may be made without departing from the scope of the invention.

What is claimed is:

1. An electron beam exposure system for writing a pattern on an object by an electron beam, comprising:
   an electron beam source for producing the electron beam;
   deflecting means for deflecting the electron beam, said deflecting means comprising a first deflector supplied with a first deflection control signal for deflecting the electron beam over a first area, and a second deflector supplied with a second deflection control signal for deflecting the electron beam over a second area, wherein said second area is smaller than the first area;
   focusing means for focusing the electron beam on the object;
   control means for controlling the deflecting means by supplying the first and second deflection control signals, said control means comprising
   a pattern memory for storing the pattern to be written on the object in the form of pattern data,
   a data control device supplied with the pattern data from the pattern memory for extracting therefrom first address data,
   a first deflection memory for storing first address data indicative of the address of the first deflection memory, second address data and first deflection data, said first deflection memory outputting the first deflection data and the second address data when addressed by the first address data, a second deflection memory for storing, in each address, second deflection data, said second deflection memory outputting the second deflection data when addressed by the second address data read out from the first deflection memory, and decoding means supplied with the first deflection data for producing the first deflection control signal in response thereto, said decoding means being further supplied with the second deflection data for producing the second deflection control signal in response thereto;

bus means connecting the data control device and the first deflector memory for passing the first address data from the data control device to the first deflector memory, said bus means further connecting the first deflection memory, the second deflection memory and the pattern generation means for passing the first deflection data read out from the first deflection memory to the decoding means, for passing the second address data from the first deflection memory to the second deflection memory, and further for passing the second deflection data read out from the second deflection memory to the decoding means;

said control device including a first data transmitter for sending out the first address data on the bus means, said first deflection memory including a first data receiver for receiving the first address data from the bus means, a second data transmitter for outputting the second address data on the bus means, and a third data transmitter for outputting the first deflection data on the bus means, said second deflection memory including a second data receiver for receiving the second address data from the bus means, and a fourth data transmitter for outputting the second deflection data on the bus means, said decoding means including a third data receiver for receiving the first deflection data from the bus means and a fourth data receiver for receiving the second deflection data from the bus means.

2. An electron beam exposure system as claimed in claim 1 in which said second address data contains an initial address of the second deflection memory from which the reading out of the second address data is to be started and a number representing the number of the data to be read starting from the initial address.

3. An electron beam exposure system as claimed in claim 2 in which said second deflection memory comprises a processor for extracting the initial address and the number of the data to be addressed starting from the initial address from the incoming second address data.

4. An electron beam exposure system as claimed in claim 1 in which each of said transmitters in the control means has a construction substantially identical with each other and comprises a bus requester unit for sending a bus request signal on the bus for requesting the use of the bus means, a device identification unit for sending a device identification code identifying the device to which the data outputted on the bus means is to be directed, a data buffer supplied with data to be transmitted for sending the same on the bus means, and a controller for controlling the bus requester unit, the device identification unit and the data buffer.

5. An electron beam exposure system as claimed in claim 4 in which each of said data receivers in the control means has a construction substantially identical with each other and comprises a device identifying unit supplied with the device identification code from the bus cooperating with the data receiver for discriminating whether the device identification code designates the device in which the device identifying unit is provided, an acquisition unit for receiving the bus request signal from the bus that cooperates with the data receiver and for outputting an acknowledge signal when it is discriminated that the device that includes the acquisition unit is the designated device, a data buffer for receiving data from the bus and for sending the same to the device that includes the data buffer, and a controller for controlling the device identifying unit, the acquisition unit, and the data buffer.

6. An electron beam exposure system as claimed in claim 5 in which said data receiver further comprises a delay unit for adjusting the timing of reading the data on the bus means by the data buffer with respect to the clock on the bus means.

7. An electron beam exposure system as claimed in claim 6 in which said bus means comprises a data bus member connected to the data transmitter and the data receiver of each device that cooperates with the bus for carrying the data from the data transmitter to the data receiver, an arbitration bus member connected to the data transmitter and the data receiver of each device that cooperates with the bus for carrying the bus request signal produced by the data transmitter and for carrying the acknowledge signal produced by the data receiver, a device identification bus member connected to the data transmitter and the data receiver of each device that cooperates with the bus for carrying the device identification code, and a clock bus member connected to the data transmitter and the data receiver of each device that cooperates with the bus for carrying the clock produced by the clock generator in the data transmitter.

8. An electron beam exposure system as claimed in claim 4 in which said data transmitter further comprises a clock generator for producing a clock that provides a timing for reading of the data on the bus by the data receiver and sending the same on the bus, said timing being set for each of the device such that an error-free reading of the data is to be achieved.

9. An electron beam exposure system as claimed in claim 1 in which said bus means comprises a first bus connecting the data control device and the first deflector memory, and a second, different bus connecting the first deflection memory, the second deflection memory and the pattern generation means.

10. An electron beam exposure system for writing a pattern on an object by an electron beam, comprising:
a stage for holding the object;
an electron beam source for producing the electron beam;
an electron lens system for directing the electron beam to the object on the stage and focusing the same on the object;
beam shaping means provided to interrupt the electron beam between the beam source and the object for shaping the electron beam traveling from the source to the object, said beam shaping means having a plurality of apertures for passing the electron beam with a shaped cross section;

deflecting means for deflecting the electron beam over the beam shaping means, said deflecting means comprising a first deflector supplied with a first deflection control signal for deflecting the electron beam over a first area of the beam shaping means and a second deflector supplied with a second deflection control signal for deflecting the electron beam over a second area of the beam shaping means, wherein said second area is smaller than the first area;

focusing means for focusing the electron beam deflected by the deflecting means on the object;

control means for controlling the deflecting means by supplying the first and second deflection control signals, said control means comprising:
  a pattern memory for storing the pattern to be written on the object in the form of pattern data,
  a data control device supplied with the pattern data from the pattern memory for extracting therefrom first address data,
  a first deflection memory for storing first address data indicative of the address of the first deflection memory, a second address data and first deflection data, said first deflection memory outputting the first deflection data and the second, corresponding address data when addressed by the first address data.
  a second deflection memory for storing, in each address, second deflection data, said second deflection memory outputting the second deflection data when addressed by the second address data read out from the first deflection memory, and
  decoding means supplied with the first deflection data for producing the first deflection control signal in response thereto, said decoding means being further supplied with the second deflection data for producing the second deflection control signal in response thereto;

bus means connecting the data control device and the first deflector memory for passing the first address data from the data control device to the first deflector memory, said bus means further connecting the first deflection memory, the second deflection memory and the pattern generation means for passing the first deflection control data read out from the first deflection memory to the decoding means, for passing the second address data from the first deflection memory to the second deflection memory, and further for passing the second deflection control data read out from the second deflection memory to the decoding means;

said data control device including a first data transmitter for sending out the first address data on the bus means, said first deflection memory including, a first data receiver for receiving the first address data from the bus means, a second data transmitter for outputting the second address data on the bus means, and a third data transmitter for outputting the first deflection control data on the bus means, said second deflection memory including a second data receiver for receiving the second address data from the bus means, and a fourth data transmitter for outputting the second deflection control data on the bus means, said decoding means including a third data receiver for receiving the first deflection control data from the bus means and a fourth data receiver for receiving the second deflection control data from the bus means.

* * * * *

UNITED STATES PATENT AND TRADEMARK OFFICE
CERTIFICATE OF CORRECTION

PATENT NO. : 5,124,560

DATED : June 23, 1992

INVENTOR(S) : Shunsuke FUEKI

It is certified that error appears in the above-identified patent and that said Letters Patent is hereby corrected as shown below:

Col. 1, line 52, after "therethrough" insert --.--.

* Col. 2, line 7, after "and" insert --is--;
*        line 11, after "and" insert --is--;
*        line 31, delete "as".

* Col. 11, line 58, change "forms" to --form--.

Signed and Sealed this

Fifteenth Day of March, 1994

Attest:

BRUCE LEHMAN

Attesting Officer      Commissioner of Patents and Trademarks